(12) United States Patent
Nakagawa (10) Patent No.: US 10,216,104 B2
(45) Date of Patent: Feb. 26, 2019

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Kazuki Nakagawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 15/012,985

(22) Filed: Feb. 2, 2016

(65) Prior Publication Data
US 2016/0223919 A1     Aug. 4, 2016

(30) Foreign Application Priority Data

Feb. 4, 2015 (JP) ................................. 2015-020611

(51) Int. Cl.
*G03F 9/00* (2006.01)
*G03F 7/00* (2006.01)
*B29C 43/58* (2006.01)

(52) U.S. Cl.
CPC .......... *G03F 9/7042* (2013.01); *G03F 7/0002* (2013.01); *B29C 43/58* (2013.01); *B29C 2043/5808* (2013.01)

(58) Field of Classification Search
CPC ............................. G03F 9/7042; G03F 9/7046
See application file for complete search history.

(56) References Cited

U.S. PATENT DOCUMENTS

| 2010/0102470 A1 | 4/2010 | Mokaberi |
| 2013/0093113 A1 | 4/2013 | Hayashi et al. |
| 2013/0134616 A1 | 5/2013 | Sato |
| 2014/0339734 A1 | 11/2014 | Murakami |

FOREIGN PATENT DOCUMENTS

| JP | 2013098291 A | 5/2013 |
| JP | 2013102132 A | 5/2013 |
| JP | 2013125817 A | 6/2013 |
| JP | 2013138175 A | 7/2013 |
| JP | 2014053495 A | 3/2014 |
| JP | 2014241396 A | 12/2014 |
| JP | 2016063054 A | 4/2016 |

OTHER PUBLICATIONS

Office Action issued in Japanese Appln. No. 2015-020611 dated Oct. 19, 2018.

*Primary Examiner* — Ryan M Ochylski
(74) *Attorney, Agent, or Firm* — Rossi, Kimms & McDowell LLP (57) ABSTRACT

The present invention provides an imprint method of forming a pattern on a shot region formed on a substrate by using a mold having a pattern region, the method comprising performing control for deformation of at least one of the pattern region and the shot region in accordance with a deformation amount, obtaining a shift amount between each of a plurality of marks provided on the pattern region and a corresponding one of a plurality of marks provided, on the shot region after the deformation, selecting marks to be used for controlling an overlay between the pattern region and the shot region so as to satisfy a preset condition based on the shift amounts, and performing feedback control for the overlay based on detection results on positions of the selected marks, after the deformation in the performing control for deformation.

11 Claims, 4 Drawing Sheets

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

An imprint apparatus which forms a pattern on an imprint material supplied onto a substrate by using a mold has attracted attention as one of mass production lithography apparatuses for semiconductor devices, magnetic storage media, and the like. In order to accurately overlay a pattern region formed on a mold and a shot region formed on a substrate, the imprint apparatus performs feedback control for the overlay based on the positions of marks respectively provided on the pattern region and the shot region. Japanese Patent Laid-Open No. 2013-102132 has proposed a method of overlaying a pattern region and a shot region by using both a technique of deforming the pattern region by applying a force to the mold and a technique of deforming the shot region by heating the substrate.

The imprint apparatus can use, for example, a method of performing feedforward control to deform at least one of a pattern region and a shot region so as to bring the shape of the pattern region and the shape of the shot region close to each other before feedback control for the overlay. When bringing the shape of a pattern region and the shape of a shot region close to each other in this feedback control for deformation, it is sometimes desirable to intentionally cause positional shifts between some of the plurality of marks on the pattern region and the corresponding marks on the shot region. In this case, performing feedback control for the overlay so as to match the marks on the pattern region with the marks on the shot region, between which the positional shifts have been intentionally caused, can make it difficult to accurately overlay the pattern region and the shot region.

SUMMARY OF THE INVENTION

The present invention provides a technique advantageous in accurately overlaying, for example, a pattern region formed on a mold and a shot region formed on a substrate.

According to one aspect of the present invention, there is provided an imprint method of forming a pattern on an imprint material on a shot region formed on a substrate by using a mold having a pattern region on which the pattern is formed, the method comprising performing control for deformation of at least one of the pattern region and the shot region in accordance with a deformation amount of the at least one region which is determined to bring a shape of the pattern region and a shape of the shot region close to each other; obtaining a shift amount between each of a plurality of marks provided on the pattern region and a corresponding one of a plurality of marks provided on the shot region after the deformation of the pattern region and the shot region; selecting, from the plurality of marks, marks to be used for controlling an overlay between the pattern region and the shot region based on the shift amounts obtained in the obtaining, such that a preset condition is satisfied; and performing feedback control for the overlay between the pattern region and the shot region based on detection results on positions of the marks selected in the selecting, after the deformation in the performing control for deformation.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

<First Embodiment>

An imprint apparatus 1 according to the first embodiment of the present invention will be described with reference to FIG. 1. The imprint apparatus 1 is used for the manufacture of semiconductor devices and the like, and performs an imprint process of molding an imprint material 14 on a substrate by using a mold 7 having a pattern region 7a on which a pattern is formed. For example, the imprint apparatus 1 cures the imprint material 14 (resin) while the mold 7 is in contact with the imprint material 14 on the substrate. The imprint apparatus 1 then can form a pattern formed from the imprint material 14 on the substrate by increasing the spacing between the mold 7 and, a substrate 11 and separating (releasing) the mold 7 from the cured imprint, material 14. Methods of curing the imprint material 14 include a heat cycle method using heat and a photo-curing method using light. The first embodiment will exemplify a case using the photo-curing method. The photo-curing method is a method of curing an uncured ultraviolet curable resin as the imprint material 14 by supplying the resin onto a substrate and irradiating the imprint, material 14 with ultraviolet light while the mold 7 is in contact with the imprint material 14.

[Apparatus Arrangement]

Figure 1:
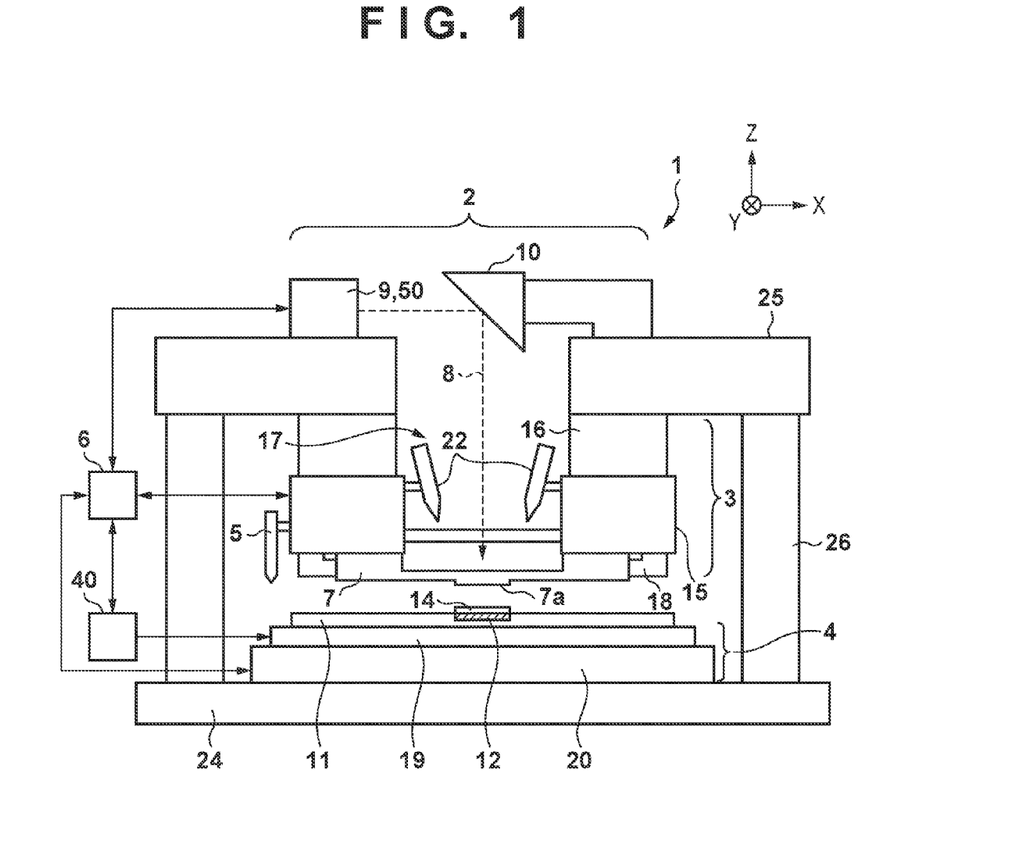
FIG. 1 is a schematic view showing an imprint apparatus according to the first embodiment.

FIG. 1 is a schematic view showing the imprint apparatus 1 according to the first embodiment. The imprint apparatus 1 can include, for example, a mold holding unit 3 which holds the mold 7, a substrate stage 4 which holds the substrate 11, an irradiation unit 2, detection units 22, and a supply unit 5. The mold holding unit 3 is fixed on a bridge plate 25 supported by a base plate 24 through columnar supports 26. The substrate stage 4 is supported so as to be movable on the base plate 24. The imprint apparatus 1 also includes a control unit 6 which includes a CPU and a memory and controls an imprint process (controls each unit of the imprint apparatus 1). An imprint process is executed by executing programs stored in the memory of the control unit 6.

The mold 7 is generally prepared by using a material through, which ultraviolet light can pass, such as quartz, and a concave-convex pattern for molding the imprint material 14 on the substrate 11 is formed on a partial region (pattern region 7a) on the surface located on the substrate side. In addition, as the substrate 11, for example, a single-crystal silicon substrate or SOI (Silicon on Insulator) substrate is used. The supply unit 5 supplies the imprint material 14 (ultraviolet curable resin) onto the upper surface (treatment surface) of the substrate 11.

The mold holding unit 3 includes a mold chuck 15 which holds a mold 7 with, for example, a vacuum suction force or electrostatic force and a mold driving unit 16 which drives the mold chuck 15 in the Z direction. The mold chuck 15 and the mold driving unit 16 respectively have opening regions 17 in their central portions (inside portions), and are configured to irradiate the substrate 11 with light emitted from the irradiation unit 2 through the mold 7. In this case, the pattern region 7a on the mold has, for example, a rectangular shape, and sometimes has a deformation component such as a magnification component or trapezoid component caused by a manufacturing error, heat deformation, or the like. For this reason, the mold holding unit 3 includes a pressurization unit 18 which applies forces to a plurality of portions on a side surface of the mold 7 so as to deform the pattern region 7a. The pressurization unit 18 can correct a deformation component in the pattern region 7a and form the pattern region 7a on the mold 7 into a desired shape by applying forces to a plurality of portions on the side surface of the mold 7. The pressurization unit 18 can include a plurality of actuators such as piezoelectric devices.

The mold driving unit 16 includes, for example, an actuator such as a linear motor or air cylinder, and drives the mold chuck 15 (mold 7) in the Z direction so as to make the mold 7 come into contact with or separate from the imprint material 14. When bringing the mold 7 into contact with the imprint material 14, the mold driving unit 16 is required to perform accurate alignment. For this reason, the mold driving unit 16 may include a plurality of driving systems such as a coarse motion driving system and a fine motion driving system. In addition, the mold driving unit 16 may have a position adjustment function of adjusting the position of the mold 7 in the X and Y directions and the θ direction (the rotational direction around the Z-axis), a tilt function for correcting the tilt of the mold 7, and the like as well as the Z-direction driving function. In the imprint apparatus 1 according to the first embodiment, the mold driving unit 16 performs the operation of changing the distance between the mold 7 and the substrate 11. However, a stage driving unit 20 of the substrate stage 4 may perform this operation. Alternatively, both the mold driving unit 16 and the stage driving unit 20 may relatively perform the operation.

The substrate stage 4 includes a substrate holding unit 19 and the stage driving unit 20, and drives the substrate 11 in the X and Y directions. The substrate holding unit 19 holds the substrate 11 with a holding force such as a vacuum suction force or electrostatic force. The stage driving unit 20 mechanically holds the substrate holding unit 19 and drives the substrate holding unit 19 (substrate 11) in the X and Y directions. The stage driving unit 20 may use, for example, a linear motor and may be constituted by a plurality of driving systems such as a coarse motion driving system and a fine motion driving system. In addition, the stage driving unit 20 may have a driving function of driving the substrate 11 in the Z direction, a position adjustment function of adjusting the position of the substrate 11 by rotating/driving the substrate 11 in the θ direction, a tilt function for correcting the tilt of the substrate 11, and the like.

A position measuring unit 40 measures the position of the substrate stage 4. The position measuring unit 40 includes, for example, a laser interferometer and an encoder, and measures the position of the substrate stage 4. The following will exemplify a case in which the position measuring unit 40 includes a laser interferometer. The laser interferometer applies laser light to a reflective plate provided on a side surface of the substrate stage 4 (for example, the substrate chuck 19), and detects the displacement of the substrate stage 4 from a reference position based on laser light reflected by the reflective plate. This allows the position measuring unit 40 to measure the current position of the substrate stage 4 based on the displacement detected by the laser interferometer.

The detection units 22 detect the position of a mark 31 (alignment mark) provided on the pattern region 7a and the position of a mark 32 (alignment mark) provided on a shot region 12. In order to accurately overlay the pattern region 7a on the shot region 12 without decreasing the throughput, marks 30, which are respectively provided on the pattern region 7a and the shot region 12, may be simultaneously detected as many as possible. However, providing a plurality of detection units 22 so as to simultaneously detect all the marks 30 can lead to increases in the complexity of the apparatus arrangement and the cost of the apparatus. For this reason, the imprint apparatus 1 is provided with the number (second number) of detection units 22 which can simultaneously detect only some of the plurality of marks 30 respectively provided on the pattern region 7a and the shot region 12. The imprint apparatus 1 according to the first embodiment is provided with, for example, the four detection units 22, which can simultaneously detect the four marks 30 provided on each of the pattern region 7a and the shot region 12. In this case, in this embodiment, marks including the mark 31 on the pattern region 7a and the mark 32 on the shot region 12 will be referred to as the marks 30.

The shot region 12 on the substrate has, for example, a rectangular shape, and sometimes has a deformation component such as a magnification component or trapezoid component caused by the influence of a series of semiconductor device manufacturing steps or the like. In this case, in order to accurately overlay the pattern region 7a formed on the mold on the shot region 12 formed on the substrate, the shot region 12 may be deformed as well as deforming the pattern region 7a by using the pressurization unit 18. For this reason, as will be described later, the imprint apparatus 1 according to the first embodiment can include a heating unit 50 which deforms the shot region 12 by heating the substrate 11. That is, the first embodiment can use at least one of the pressurization unit 18 and the heating unit 50 as a deforming unit which deforms at least one of the pattern region 7a and the shot region 12.

The irradiation unit 2 can include a curing unit 9 which cures the imprint material 14 on the substrate by irradiating the imprint material 14 with light and the heating unit 50 which deforms the shot region 12 by irradiating the substrate 11 with light. The irradiation unit 2 can also include an optical member 10 which guides light emitted from the curing unit 9 and light emitted from the heating unit 50 onto the substrate. As shown in FIG. 1, the imprint apparatus 1 according to the first embodiment includes the curing unit 9 and the heating unit 50 as one unit. However, this is not exhaustive, and the apparatus may include these units as separate units. The curing unit 9 can include a light source which emits light (ultraviolet light) which cures the imprint material 14 on the substrate and an optical system which shapes light emitted from the light source into light suitable for an imprint process. In addition, the heating unit 50 can include a light, source which emits light having specific wavelength that does not cure the imprint material 14 supplied onto the substrate and is suitable for heating the substrate 11 and a light adjusting device for adjusting the intensity of light, emitted from the light source. The light adjusting device of the heating unit 50 can adjust the intensity of light applied to the substrate 11 so as to form a temperature distribution on the shot region 12 into a desired temperature distribution. As the light adjusting device of the heating unit 50, for example, a liquid crystal apparatus, a DMD (Digital Mirror Device), or the like can be adopted.

[Imprint Process]

An imprint process in the imprint apparatus 1 according to the first embodiment will be described next. The control unit 6 controls the substrate stage 4 so as to arrange the shot region 12 on the substrate, onto which the pattern on the mold 7 is to be transferred, below the supply unit 5. When the shot region 12 is arranged below the supply unit 5, the control unit 6 controls the supply unit 5 to supply the imprint material 14 to the shot region 12. The control unit 6 supplies the imprint material 14 to the shot region 12, and then controls the substrate stage 4 so as to arrange the shot region 12 below the pattern region 7a on the mold. Upon arranging the shot region 12 below the pattern region 7a on the mold, the control unit 6 controls the mold driving unit 16 so as to drive the mold 7 in the −Z direction to make the mold 7 come into contact with the imprint material 14 on the substrate (mold pressing step). The control unit 6 maintains the contact between the mold 7 and the imprint material 14 on the substrate for a predetermined period of time. This makes it possible to fully fill the pattern on the mold 7 with the imprint material 14 on the substrate.

The control unit 6 performs alignment between the pattern region 7a on the mold 7 and the shot region 12 in the X and Y directions while the mold 7 is in contact with the imprint material 14 on the substrate. Alignment can include a "deforming step" of deforming the pattern region 7a and the shot region 12 so as to bring the shape of the pattern region 7a close to that of the shot region 12 and a "overlaying step" of overlaying the pattern region 7a on the shot region 12. The details of alignment between the pattern region 7a and the shot region 12 will be described later. Upon aligning the pattern region 7a with the shot region 12, the control unit 6 controls the curing unit 9 to irradiate the imprint material 14 on the substrate with light (ultraviolet light) through the mold 7. The control unit 6 then controls the mold driving unit 16 to drive the mold 7 in the +Z direction to separate the mold 7 from the imprint, material 14 on the substrate, which is cured by irradiation with light (separating step). This makes it possible to mold the imprint material 14 on the substrate by using the mold 7 and form the pattern formed from the imprint material 14 on the substrate. Such an imprint process is performed for each of a plurality of shot regions 12 on the substrate.

[Alignment]

Alignment in the imprint apparatus 1 according to the first embodiment will be described next. The imprint apparatus 1 determines a deformation amount for the deformation of at least one of the pattern region 7a and the shot region 12 to bring their shapes close to each other based on, for example, shape information of the pattern region 7a and shot region 12 which is obtained in advance. Based on the determined deformation amount, control is performed to deform at least one of the regions. Assume that feedforward control (to be referred to as FF control hereinafter) is performed to deform at least one of the regions based on a deformation amount. In this case, performing only FF control sometimes causes relative shifts between the position and shape of the pattern region 7a and those of the shot region 12. For this reason, when performing alignment, the imprint apparatus 1 performs a "overlaying step" after a "deforming step" in which FF control is performed to deform at least one of the pattern region 7a and the shot region based on the deformation amount. In the "overlaying step", feedback control (to be referred to as FB control hereinafter) for the overlay between the pattern region 7a and the shot region 12 is performed based on a detection result obtained by each detection unit 22 after the deformation of at least one of the regions in the deforming step. This overlaying step corrects the relative positions and shapes of the pattern region 7a and shot region 12.

A deforming step is a step of performing FF control to deform at least one of the pattern region 7a and the shot region 12 so as to correct a high-order component such as an arch component or barrel component contained in the pattern region 7a or the shot region 12. Therefore, a deforming step may be performed based on shape information obtained by detecting as many marks 30 as possible of a plurality of marks respectively provided on the pattern region 7a and the shot region 12. In the first embodiment, shape information is obtained by detecting the first number (for example, 17) of marks 30 of the plurality of marks 30 respectively provided on the pattern region 7a and the shot region 12.

On the other hand, the overlaying step is a step of performing FB control for the overlay between the pattern region 7a and the shot region 12 so as to perform low-order component correction such as shift correction or magnification correction between the pattern region 7a and the shot region 12 based on a detection result obtained by each detection unit 22. The overlaying step can be performed while the pattern region 7a and the shot region 12 are deformed in the deforming step. That is, the overlaying step is a step of correcting only low-order components, and hence can he performed by using a smaller number (second number) of marks 30 than the number (first number) of marks 30 detected to obtain shape information used in the deforming step. The second number is, for example, the number of marks 30 which can be made to simultaneously fall within the detection visual fields of the plurality of detection units 22 in the overlaying step. Since the imprint apparatus 1 according to the first embodiment is provided with the four detection units 22, the positions of the four marks 30 are simultaneously detected in the overlaying step, and the pattern region 7a can be overlayed on the shot region 12 based on the detection results.

Figure 2:
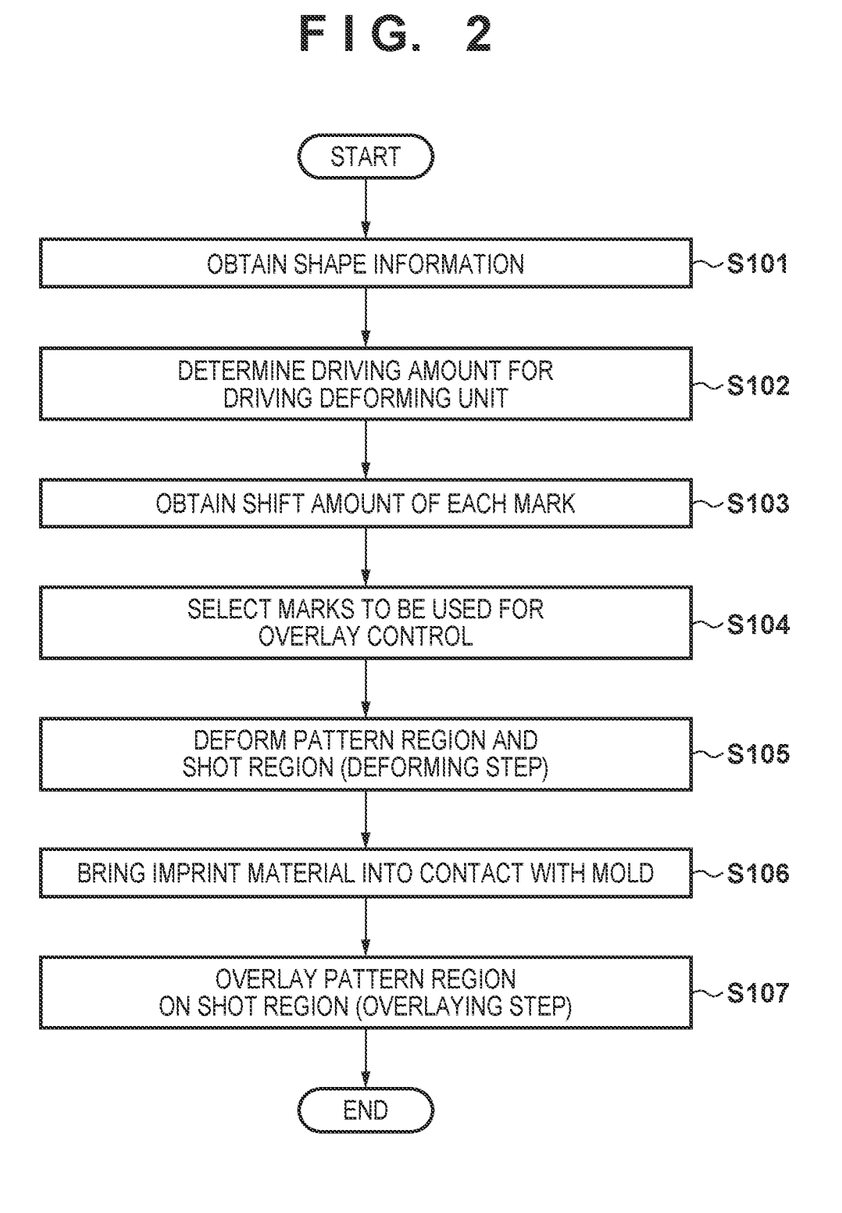
FIG. 2 is a flowchart showing a procedure for alignment in the imprint apparatus according to the first embodiment.

Alignment in the imprint apparatus 1 according to the first embodiment will be described below with reference to FIG. 2. FIG. 2 is a flowchart showing a procedure for alignment in the imprint apparatus 1 according to the first embodiment.

In step S101, the control unit 6 obtains shape information of the pattern region 7a on the mold and the shot region 12 on the substrate. In the first embodiment, as described above, the shape information is obtained by detecting the positions of the first number (17) of marks 30 of the plurality of marks 30 respectively provided on the pattern region 7a and the shot region 12. However, the number of detection units 22 in the imprint apparatus 1 according to the first embodiment is the second number (four) smaller than the first number.

For this reason, it is desirable to obtain, in advance, as shape information, the shape of at least one of the pattern region 7a and the shot region 12 by detecting the first number of marks 30 using a measuring device outside the imprint apparatus 1. This allows the control unit 6 to obtain shape information from the external measuring device and obtain the shape difference between the pattern region 7a and the shot region 12 so as to include high-order components.

Figure 3A:
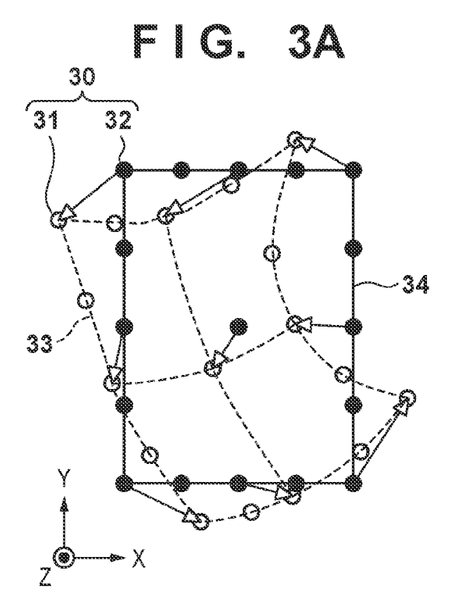
FIG. 3A is a view showing the shape of a pattern region and the shape of a shot region.

FIG. 3A is a view showing the shape of the pattern region 7a and the shape of the shot region 12. Referring to FIG. 3A, a broken line 33 represents the shape of the pattern region 7a, and a solid line 34 represents the shape of the shot region 12. These shapes are respectively obtained from the positions of 17 marks 31 provided on the pattern region 7a and 17 marks 32 provided on the shot region 12. For the sake of simplicity, FIG. 3A shows that the shape of the shot region 12 indicated by the solid line 34 is an ideal shape (rectangular shape). In practice, however, deformation including high- and low-order components has sometimes also occurred in the shot region 12. That is, referring to FIG. 3A, the broken line 33 can be regarded as the actual shape difference between the pattern region 7a and the shot region 12, and the solid line 34 can be regarded as the target shape difference between the pattern region 7a and the shot region 12.

In this case, in the first embodiment, the measuring device outside the imprint apparatus 1 obtains the shape of the pattern region 7a and the shape of the shot region 12 as shape information. However, this is not exhaustive. For example, it is possible to obtain the shape of the pattern region 7a and the shape of the shot region 12 inside the imprint apparatus 1 by detecting the positions of the first number of marks 30 by repeatedly detecting the positions of the marks 30 using the four detection units 22 and moving the substrate stage 4.

In step S102, the control unit 6 obtains the deformation amount of at least one of the pattern region 7a and the shot region 12 so as to bring the shape of the pattern region 7a close to that of the shot region 12 based on shape information obtained in step S101. The control unit 6 then determines a driving amount for driving the deforming unit (at least one of the pressurization unit 18 and the heating unit 50) based on the obtained deformation amount. The determined driving amount is used in the subsequent deforming step (step S105). In the deforming step, in order to correct high-order components, it is desirable to use both the heating unit 50 which deforms the shot region 12 by heating the substrate 11 and the pressurization unit 18 which deforms the pattern region 7a by applying a force to the mold 7. In this case, the control unit 6 can determine both a driving amount for driving the pressurization unit 18 and a driving amount for driving the heating unit 50 so as to bring the shape of the pattern region 7a close to that of the shot region 12. In this case, when deforming the pattern region 7a or the shot region 12, the control unit 6 can determine a driving amount for driving the pressurization unit 18 or a driving amount for driving the heating unit 50.

In step S103, the control unit 6 obtains a shift amount generated between the mark 31 on the pattern region 7a and the mark 32 on the shot region 12 after the deformation of at least one of the pattern region 7a and the shot region 12 based on the driving amount (deformation amount) determined in step S102. The control unit 6 obtains such a shift amount with respect to each of the plurality of marks 30 respectively provided on the pattern region 7a and the shot region 12. In step S104, the control unit 6 selects the marks 30 to be used for the overlay control from the plurality of marks 30 so as to satisfy a preset condition based on the shift amount concerning each mark 30 which is obtained in step S103. In this case, the control unit 6 obtains (estimates), in step S103, the shift amount between the mark 31 on the pattern region 7a and the mark 32 on the shot region 12 after deformation based on the driving amount (deformation amount) determined in step S102. However, this is not exhaustive. For example, this shift amount may be obtained by causing the detection units 22 to detect the mark 31 on the pattern region 7a and the mark 32 on the shot region 12 after the deformation of at least one of the regions.

Figure 3B:
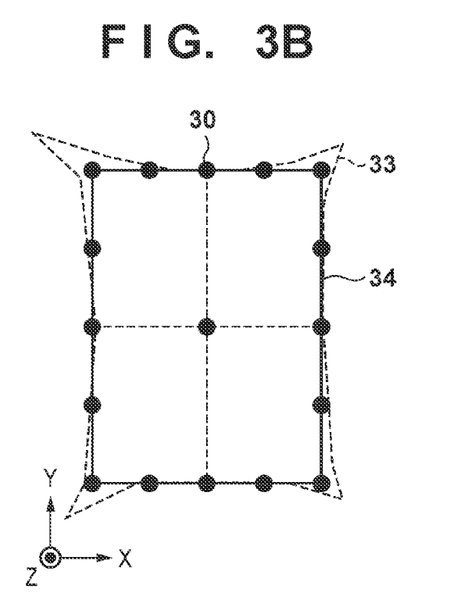
FIG. 3B is a view showing the shape of the pattern region and the shape of the shot region.

FIG. 3B is a view showing the shape of the pattern region 7a and the shape of the shot region 12 when the shape of the pattern region 7a is brought close to that of the shot region 12 by driving the pressurization unit 18 and the heating unit 50 based on the driving amounts determined in step S102. When the pressurization unit 18 applies a force to the mold 7, unintended deformation caused by the Poisson's ratio can be generated in the pattern region 7a. On the other hand, when the heating unit 50 heats the substrate 11, isotropic deformation can be generated in the shot region 12. For this reason, using both the pressurization unit 18 and the heating unit 50 can reduce the deformation of the pattern region 7a caused by the Poisson's ratio by the isotropic deformation of the shot region 12. This facilitates bringing the shape of the pattern region 7a close to that of the shot region 12.

When bringing the shape of the pattern region 7a close to that of the shot region 12, it is sometimes desirable to intentionally cause a positional shift between some of the plurality of marks 30, for example, the mark 31 on the pattern region 7a and the mark 32 on the shot region 12. For example, in the case shown in FIG. 3B, the shape of the pattern region 7a is brought close to that of the shot region 12 by intentionally causing positional shifts between the marks 31 on the four corners of the pattern region 7a and the marks 32 on the four corners of the shot region 12. In this case, if FB control for the overlay is performed to match the marks 31 on the pattern region 7a with the marks 32 on the shot region 12 in the X and Y directions, between which the positional shifts have been intentionally caused, it can be difficult to accurately overlay the pattern region 7a on the shot region 12. That is, it can be difficult to achieve desired overlay accuracy between the pattern region 7a and the shot region 12.

Figure 4A:
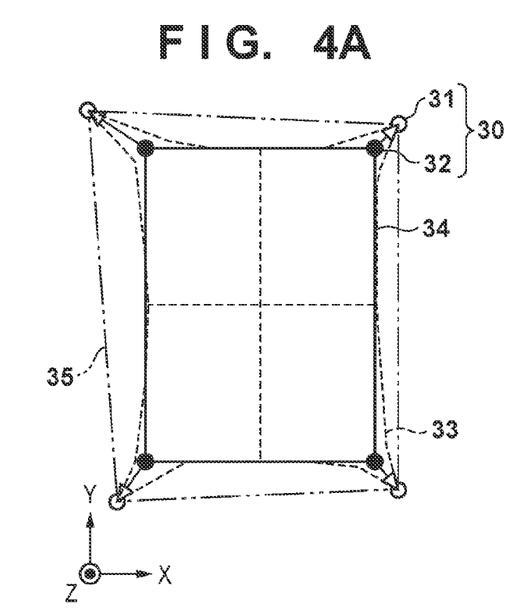
FIG. 4A is a view for explaining the overlay between a pattern region and a shot region.
Figure 4B:
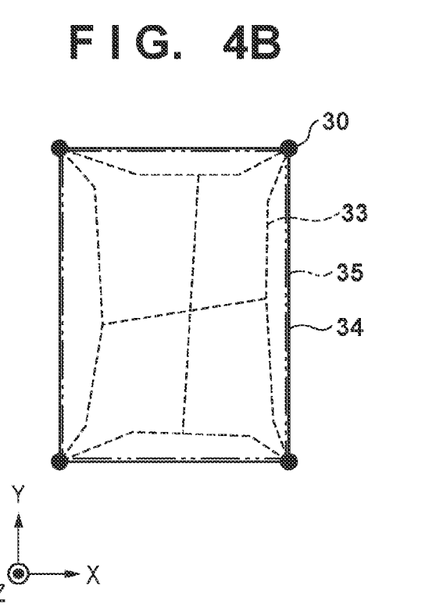
FIG. 4B is a view for explaining the overlay between the pattern region and the shot region.

FIGS. 4A and 4B are views for explaining the overlay between the pattern region 7a and the shot region 12. As described above, in order to bring the shape of the pattern region 7a close to that of the shot region 12, it is sometimes desirable to intentionally cause positional shifts between, for example, the marks 30 on the four corners, that is, the marks 31 on the pattern region 7a and the marks 32 on the shot region 12. FIG. 4A is a view showing a state in which positional shifts are caused between the marks 30 on the four corners of each of the pattern region 7a and the shot region 12, that is, the marks 31 on the pattern region 7a and the marks 32 on the shot region 12. Referring to FIG. 4A, the broken line 33 represents the shape of the pattern region 7a, and the solid line 34 represents the shape of the shot region 12. Assume that in this case, the overlay accuracy between the pattern region 7a and the shot region 12 is desired accuracy.

In this state, when causing the respective detection units 22 to detect only the positions of the marks 30 on the four corners of each of the pattern region 7a and the shot region 12, the control unit 6 can recognize the shape of the pattern region 7a as a linear shape like that indicated by a chain double-dashed line 35 in FIG. 4A. Assume a case in which at least one of the pattern region 7a and the shot region 12 is deformed to match the marks 31 on the four corners of the pattern region 7a with the marks 32 on the four corners of the shot region 12. In this case, as shown in FIG. 4B, the shape (chain double-dashed line 35) of the pattern region 7a recognized based on detection results and the shape (solid line 34) of the shot region 12 are overlayed on each other. However, the actual shape (broken line 33) of the pattern region 7a is not overlayed on the shape (solid line 34) of the shot region 12. This can decrease the overlay accuracy between the pattern region 7a and the shot region 12.

For this reason, in step S103, the control unit 6 obtains the shift amount of each of the plurality of marks 30 after the deformation of at least one of the pattern region 7a and the shot region 12. In step S104, the control unit 6 selects the marks 30 to be used for the overlay control from the plurality of marks 30 based on obtained it amounts such that a preset condition is satisfied. For example, the condition may be set to include the selection of the mark 30 having a shift amount smaller than the average value of the shift amounts of the plurality of marks 30. Alternatively, when two or more marks 30 are provided on each side of each of the pattern region 7a and the shot region 12, the condition may be set to include the selection of at least one mark 30 on each side. In this case, the condition may be set to select the marks 30 in ascending order to shift amounts concerning the respective sides. In this case, the control unit 6 may select the marks 30 to be used for a overlaying step based on not only obtained shift amounts but also overlay accuracy on the substrate on which the imprint material 14 has already been molded by the mold 7. Assume, for example, a case in which there are several marks 30 having shift amounts smaller than the average value of the shift amounts of the plurality of marks 30. In this case, the control unit 6 may select, as the marks 30 to be used for a overlaying step, the marks 30 arranged at the same positions as those of marks used for a overlaying step for a substrate, of a plurality of substrates on which the imprint materials 14 have already been molded, which has exhibited the minimum overlay accuracy. Note that a "side" is a line between vertices, and includes a curve instead of being limited to a straight line.

It is possible to obtain a shift amount based on, for example, information (to be referred to as deformation amount information hereinafter) representing the relationship between the driving amount of the pressurization unit 18 and the deformation amount of the pattern region 7a and the relationship between the driving amount of the heating unit 50 and the deformation amount of the shot region 12. Deformation amount information is represented by a database, function, or the like. It is possible to obtain the relationship between the driving amount of the pressurization unit 18 and the deformation amount of the pattern region 7a by, for example, performing deformation analysis of the mold 7 at the time of driving of the pressurization unit 18 in a simulation, an experiment using a dummy substrate, or the like. Likewise, it is possible to obtain the relationship between the driving amount of the heating unit 50 and the deformation amount of the shot region 12 by, for example, performing deformation analysis of the substrate 11 at the time of driving of the heating unit 50 in a simulation, an experiment using a dummy substrate, or the like. In this case, the dummy substrate may be a substrate on which no imprint process is to be performed or a substrate (for example, the first substrate of a lot), of a plurality of substrates for which imprint processes should be performed, for which an imprint process is to be performed first.

In step S105, the control unit 6 controls the pressurization unit 18 and the heating unit 50, in accordance with the driving amounts (deformation amounts) determined in step S102, to control the deformations of the pattern region 7a and the shot region 12 so as to bring the shape of the pattern region 7a close to that of the shot region 12 (deforming step). The first embodiment is configured to control both the pressurization unit 18 and the heating unit 50 to correct high-order components so as to deform both the pattern region 7a and the shot region 12. However, this is not exhaustive. For example, at least one of the pressurization unit 18 and the heating unit 50 may be controlled to deform at least one of the pattern region 7a and the shot region 12. In step S106, the control unit 6 controls the mold holding unit 3 to bring the mold 7 into contact with the imprint material 14 on the shot region. In the first embodiment, the mold 7 is brought into contact with the imprint material 14 after step S105, which is the deforming step. However, this is not exhaustive. The above operation may be performed before step S105. That is, after the mold 7 is brought into contact with the imprint material 14, at least one of the pattern region 7a and the shot region 12 may be controlled.

In step S107, the control unit 6 causes the plurality of detection units 22 to detect the positions of the marks 30 selected in step S104, and performs FB control for the overlay between the pattern region 7a and the shot region 12 based on the detection results obtained by the respective detection units 22 (overlaying step). In the overlaying step, the control unit 6 performs adjustment (for example, translation shift correction and rotation correction) of the relative positions of the pattern region 7a and the shot region and deformation (for example, magnification correction and trapezoid correction) of at least one of the pattern region 7a and the shot region 12. In "adjustment", the control unit 6 performs translation shift correction and rotation correction for the pattern region 7a and the shot region 12 so as to maintain the state of the shape of the region deformed in the deforming step. The control unit 6 performs "adjustment" by, for example, controlling the stage driving unit 20 of the substrate stage 4. In addition, in "deformation", the control unit 6 performs magnification correction and trapezoid correction between the pattern region 7a and the shot region 12 by deforming at least one of the pattern region 7a and the shot region 12. It is possible to perform "deformation" by, for example, controlling at least one of the pressurization unit 18 and the heating unit 50.

Assume that in step S104, the control unit 6 has selected, from the plurality of marks 30, four marks 30a to 30d, each having a shift amount smaller than the average value of the shift amounts of the plurality of marks 30, as the marks 30 to be used in an alignment step. In this case, when the four detection units 22 detect the positions of the four marks 30a to 30d, the control unit 6 can recognize the shape of the pattern region 7a as a linear shape like that indicated by a chain double-dashed line 36 in FIG. 5A. Assume a case in which FB control for the overlay is performed with respect to the four marks 30a to 30d selected in step S104 so as to match the marks 31 on the pattern region 7a with the marks 32 on the shot region 12 in the X and Y directions. In this case, as shown in FIG. 5B, the shape (chain double-dashed line 36) of the pattern region 7a and the shape (solid line 34) of the shot region 12, recognized based on detection results, are overlayed on each other. The imprint apparatus 1 according to the first embodiment performs FB control for the overlay by using the marks 30 each having a shift amount smaller than the average value, and hence can suppress a deterioration in the overlay accuracy between the pattern region 7a and the shot region 12.

Figure 5A:
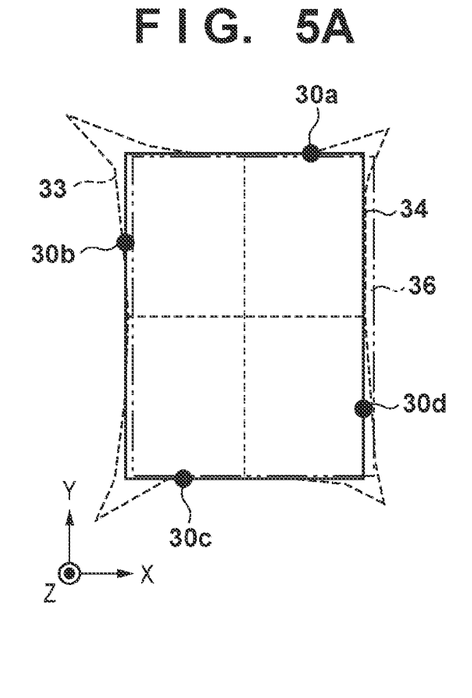
FIG. 5A is a view for explaining the overlay between a pattern region and a shot region.
Figure 5B:
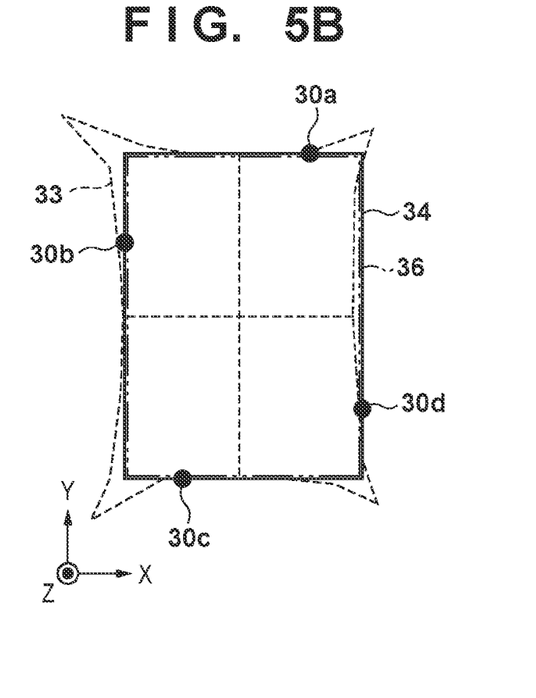
FIG. 5B is a view for explaining the overlay between the pattern region and the shot region.
Figure 6:
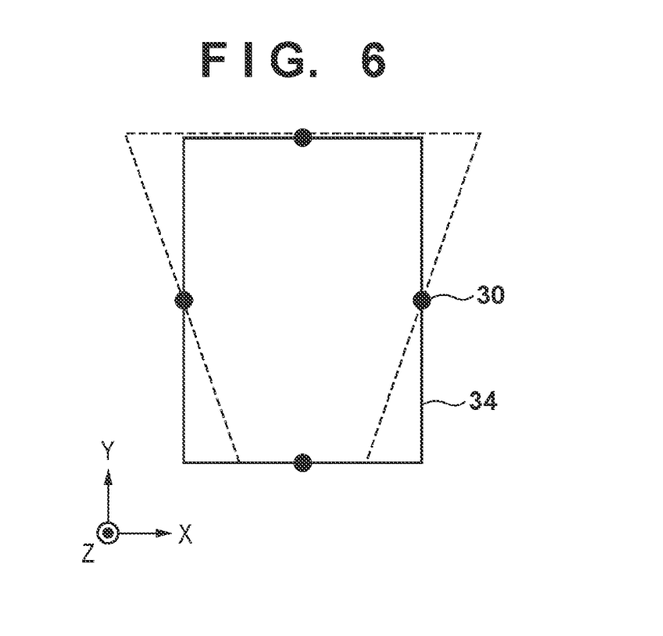
FIG. 6 is a view for explaining a reason why a mark arranged at a position shifted from the center of each side is selected.

In this case, it is sometimes desirable to arrange the four marks 30a to 30d selected as the marks 30 to be used for a overlaying step at positions shifted from the centers of the respective sides, as shown in FIGS. 5A and 5B. This is because when for example, at least one of the pattern region 7a and the shot region 12 has a shape containing a trapezoid component, it can be difficult to recognize the shape containing the trapezoid component from detection results on the positions of the marks 30 arranged in the centers of the respective sides, as shown in FIG. 6. In this case, trapezoid correction cannot be performed in a overlaying step, and hence it can be difficult to accurately overlay the pattern region 7a on the shot region 12. For this reason, in step S104, the control unit 6 may select, as the marks 30 to be used for the overlay control, the marks 30 arranged at positions shifted from the centers of the respective side from the marks 30 each having a shift amount smaller than the average of the shift amounts of the plurality of marks 30.

As described above, the imprint apparatus 1 according to the first embodiment obtains the shift amounts of the marks 31 on the pattern region 7a and the marks 32 on the shot region 12 after deformation control of at least one of the pattern region 7a and the shot region 12. The control unit 6 then selects the marks 30 to be used in a overlaying step based on the obtained shift amounts, and performs FB control for the overlay between the pattern region 7a and the shot region 12 based on the detection results on the positions of the selected marks 30. This allows the imprint apparatus 1 according to the first embodiment to accurately overlay the pattern region 7a formed on the mold on the shot region 12 formed on the substrate.

<Second Embodiment>

The first embodiment has exemplified the case in which the same marks 30 are used for "adjustment" and "deformation" in a overlaying step. However, different marks 30 may be used for "adjustment" and "deformation". For example, increasing the distances between the positions of the marks 30 can reduce the influence of errors contained in detection results on the positions of the respective marks 30, thereby improving measurement accuracy concerning the distances between the marks. Therefore, the marks 30 arranged on the four corners of each of a pattern region 7a and a shot region 12 may be used when performing "adjustment". On the other hand, as described above, when performing "deformation", the marks each having a shift amount smaller than the average of the shift amounts of the plurality of marks 30 may be used. That is, a control unit 6 may switch between the marks 30 to be used for "adjustment" and "deformation" in a overlaying step.

<Embodiment of Method of Manufacturing Article>

A method of manufacturing an article according to an embodiment of the present invention is suitable for manufacturing an article such as a microdevice such as a semiconductor device or an element having a microstructure. This method of manufacturing an article according to this embodiment includes a step of forming a pattern on a resin applied on a substrate by using the above imprint apparatus (a step of performing an imprint process on the substrate) and a step of processing the substrate (the substrate on which the imprint process has been performed) on which the pattern has been formed in the preceding step. The manufacturing method further includes other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

<Other Embodiments>

Embodiment(s) of the present invention (the control unit) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment (s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment (s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-020611 filed on Feb. 4, 2015, which is hereby incorporated by reference herein in its entirety.

What is claimed is:

1. An imprint method of forming a pattern of an imprint material on a shot region formed on a substrate by using a mold having a pattern region on which the pattern is formed, the method comprising:
    deforming at least one of a shape of the pattern region and a shape of the shot region in accordance with a deformation amount determined to make the shapes of the pattern region and the shot region more similar;
    obtaining a shift amount between each of a plurality of marks provided on the pattern region and a corresponding one of a plurality of marks provided on the shot region, the shift amount being obtained based on the deforming the at least one of the shape of the pattern region and the shape of the shot region;
    selecting marks to be used for controlling an overlay between the pattern region and the shot region based on the shift amounts obtained in the obtaining, such that a preset condition is satisfied; and
    performing feedback control for the overlay between the pattern region and the shot region based on detection results on positions of the marks selected in the selecting, after deforming the at least one of the shape of the pattern region and the shape of the shot region.

2. The method according to claim 1, wherein the preset condition includes selecting a mark having the shift amount smaller than an average value of the shift amounts of the plurality of marks.

3. The method according to claim 1, wherein after deforming the at least one of the shape of the pattern region and the shape of the shot region, the deformed at least one region is provided with not less than two marks on each side, and
the preset condition includes selecting at least one mark from the not less than two marks with respect to each side of the deformed at least one region.

4. The method according to claim 3, wherein the preset condition includes selecting a mark arranged at a position shifted from the center of each side of the deformed at least one region.

5. The method according to claim 3, wherein the preset condition includes selecting marks in ascending order to the shift amounts concerning each side of the deformed at least one region.

6. The method according to claim 1, wherein the preset condition includes selecting marks of a number which are configured to simultaneously fall within a detection field in the performing feedback control for the overlay.

7. The method according to claim 1, wherein the deformation amount is determined by using information representing the shape of the pattern region and the shape of the shot region, and
in the selecting, marks of a number smaller than the number of marks detected for obtaining the information are selected from the plurality of marks.

8. The method according to claim 1, wherein in the selecting, marks to be used for the feedback control for the overlay are selected also based on overlay accuracy on a substrate on which an imprint material has already been formed by the mold.

9. The method according to claim 1, wherein in the deforming the at least one of the shape of the pattern region and the shape of the shot region, a feedforward control for the deformation is performed in accordance with the deformation amount.

10. The method according to claim 1, wherein the performing feedback control for the overlay includes performing at least one of magnification correction and trapezoid correction between the pattern region and the shot region.

11. A method of manufacturing an article, the method comprising:
forming a pattern on a substrate using an imprint method; and
processing the substrate, on which the pattern has been formed, to manufacture the article,
wherein the imprint method forms a pattern of an imprint material on a shot region formed on a substrate by using a mold having a pattern region on which a pattern is formed and includes:
deforming at least one of a shape of the pattern region and a shape of the shot region in accordance with a deformation amount determined to make the shapes of the pattern region and the shot region more similar;
obtaining a shift amount between each of a plurality of marks provided on the pattern region and a corresponding one of a plurality of marks provided on the shot region, the shift amount being obtained based on the deforming the at least one of the shape of the pattern region and the shape of the shot region;
selecting marks to be used for controlling an overlay between the pattern region and the shot region based on the shift amounts obtained in the obtaining, such that a preset condition is satisfied; and
performing feedback control for the overlay between the pattern region and the shot region based on detection results on positions of the marks selected in the selecting, after deforming the at least one of the shape of the pattern region and the shape of the shot region.

\* \* \* \* \*